(12) United States Patent
Lee

(10) Patent No.: US 6,486,508 B1
(45) Date of Patent: Nov. 26, 2002

(54) NON-VOLATILE SEMICONDUCTOR MEMORY DEVICES WITH CONTROL GATES OVERLAPPING PAIRS OF FLOATING GATES

(75) Inventor: Yong-Kyu Lee, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/568,147

(22) Filed: May 10, 2000

(30) Foreign Application Priority Data

May 12, 1999 (KR) .............................. 99-16933

(51) Int. Cl.[7] .............................. H01L 29/788
(52) U.S. Cl. .................. 257/316; 257/315; 257/319; 257/321; 438/266; 438/201; 438/211; 438/257
(58) Field of Search .................. 257/321, 315, 257/316, 319; 438/201, 211, 257, 266, 263, 264, 594

(56) References Cited

U.S. PATENT DOCUMENTS

| | | | | |
|---|---|---|---|---|
| 5,045,488 A | | 9/1991 | Yeh | 438/257 |
| 5,844,270 A | | 12/1998 | Kim et al. | 257/315 |
| 5,888,871 A | * | 3/1999 | Cho et al. | 438/263 |
| 5,977,584 A | | 11/1999 | Kim | 257/315 |
| 6,066,874 A | * | 5/2000 | Lin et al. | 257/315 |
| 6,096,662 A | * | 8/2000 | Ngo et al. | 438/798 |
| 6,144,064 A | | 11/2000 | Cho et al. | |
| 6,184,085 B1 | | 2/2001 | Jeong | |
| 6,261,906 B1 | * | 7/2001 | Hsu et al. | 438/266 |
| 6,262,917 B1 | * | 7/2001 | Lee | 365/185.33 |

* cited by examiner

Primary Examiner—Nathan J. Flynn
Assistant Examiner—Scott R Wilson
(74) Attorney, Agent, or Firm—Myers Bigel Sibley & Sajovec

(57) ABSTRACT

A non-volatile semiconductor memory device and the fabricating method thereof, wherein control gates respectively formed at the active areas of the resultant structure for getting a corresponding pair of split floating gates continuously overlapped and buried diffusion areas formed at the substrate of the periphery of the field insulating layer positioned between neighboring source areas to prevent the source areas from being electrically disconnected by the field insulating layer, even if the floating gate pattern and the control gate pattern are respectively made by separate processes, so that there will be no mismatching between the aforementioned two patterns, thereby leading to no tendency of showing different characteristics of memory cells in accordance with odd/even numbered word lines, the schematic characteristic of cells makes it possible to program and erase a byte, and one contact hole is not used at each bit line, the number of contact holes gets small, thereby making it possible to scale down cells.

17 Claims, 9 Drawing Sheets

NON-VOLATILE SEMICONDUCTOR MEMORY DEVICES WITH CONTROL GATES OVERLAPPING PAIRS OF FLOATING GATES

BACKGROUND OF THE INVENTION

1. Field of the Invention

The present invention relates to a non-volatile semiconductor memory device and a fabricating method thereof, and more particularly to a non-volatile semiconductor memory device and a fabricating method thereof, which prevents mismatching between a split floating gate and a control gate, so that there will be no different characteristics of memory cells in response to odd/ even numbered word line.

2. Description of the Prior Art

In general, a non-volatile semiconductor memory device has recently shown a tendency to be widely used in a variety of fields since it can not only erase/store data with electrical connection, but also store data without supply of electricity. These memory cells of the non-volatile semiconductor memory device are classified into NAND type and NOR type.

There are different advantages in those NAND and NOR types of memory cells in response to the trend of becoming high integration and high speed of memory cells, so that they have been increasingly used in a variety of applications to make the best use of those advantages of respective types.

The NOR type of the non-volatile semiconductor memory device comprises a plurality of memory cells having a transistor at a bit line connected in parallel and only one memory cell transistor positioned between a drain connected to the bit line and a source connected to a common source line. There is an advantage in the NOR type of a non-volatile semiconductor memory device in that the current of memory cells is high enough to operate at high speed, but a disadvantage in that it is difficult to have a high integration due to large area taken by the contact of bit lines and source lines.

The NOR type of the non-volatile memory device is constructed in a deposition structure in which a floating gate and a control gate are deposited with an insulation interlayer therebetween, and the processes thereof will be described below.

First of all, in programming data, when voltage is applied to the bit line and the control gate connected with the drain of memory cells, electric current flows between the source and the drain, so that electrons are injected into the floating gate by a channel hot electron injection mechanism. As a result, data are programmed.

In erasing, when voltage is applied to a source, electrons are flown out of the floating gate by a Fowler-Nordheim tunneling mechanism. As a result, data are erased.

In reading, when adequate voltage is applied to the bit line and the control gate of the selected memory cells, the presence of current at the selected memory cell transistor is read. As a result, data are read.

As memory cells are connected in parallel to the bit line in the non-volatile memory device, if the threshold voltage of the memory cell transistor gets lower than the voltage (usually 0V) applied to the control gate of the not-selected memory cells, current flows between the source and the drain, regardless of the ON/OFF state of the selected memory cells, an operational failure (wrong operation) occurs that all the memory cells may be read as the ON state thereof. Thus, there is a difficulty in the nonvolatile memory device that the threshold voltage should be strictly controlled. Also, because excessive amount of current flows at the memory cells in programming data by the channel hot electron injection mechanism, a high capacity of the pump may be required for generating the voltage in programming data.

In order to solve the aforementioned problem, the non-volatile semiconductor memory devices in a variety of structures, commonly called a split gate type, have been suggested. A representative example of all has been disclosed in U.S. Pat. No. 5,045,488 titled as a "METHOD OF MANUFACTURING A SINGLE TRANSISTOR NON-VOLATILE, ELECTRICALLY ALTERABLE SEMICONDUCTOR MEMORY DEVICE."

As shown in FIGS. 1 through 3, the non-volatile semiconductor memory device disclosed therein comprises: an active area 11 of a substrate 10 isolated by a field insulating layer 13; a pair of floating gates 15 arranged at a first gate insulating layer of the active area 11 with a source area 17 therebetween; an oxide layer 19 positioned at the floating gates 15; second gate insulating layers 21 positioned at the lateral surfaces of the floating gates 15 to be used for tunneling in erasing data; and control gates 23 simultaneously overlapping an external side of the floating gates 15, the second gate insulating layer 21 and a part of the drain area 18, that is, extensively from an external portion of the floating gate 15 to a part of the drain area 18. An interlayer 25 is deposited at the aforementioned structure, and a bit line 27 is formed for electrical connection through a contact hole 26 to the drain area 18.

At this time, the channel areas formed by the floating gates 15 and the control gates 23 are connected in series. The area marked with a dot line represents a unit cell area (UCA). L1 and L2 respectively symbolize gate lengths of selected memory cell transistors. Even if only a pair of floating gates corresponding to an active area 110 are shown in the drawings for convenient description, it should be taken for granted that a number of pairs of floating gates are repeatedly arranged correspondingly to the active areas 110 in actuality.

Operation of the conventional non-volatile semiconductor memory device thus constructed will be described below. First of all, in programming data, if a high voltage is applied to the source area 17 of the UCA, the floating gate 15 is induced into a predetermined voltage by a coupling phenomenon. Then, if a voltage, for example, higher than the threshold voltage of the transistor formed by the control gate and the channel formed by the floating gate 15 is applied to the control gate 23, current flows between the source area 17 and the drain area 18. At this time, the channel hot electron injection mechanism is performed, so that electrons are injected into the floating gate 15. As a result, data is programmed.

Therefore, if voltage applied to the control gate 23 is properly controlled, hot electrons can be formed at a lower end of the floating gate 15 and the electric field gets strong enough to improve the data programming efficiency. In addition, the current flowing between the source area 17 and the drain area 18 can also be restricted to reduce power consumption, thereby no longer requiring a high capacity of a pump to be used at the stacked NOR type of the non-volatile memory device.

In erasing data, if a high voltage is applied to the control gate 23, the electrons collected at the floating gate 15 are flown out through the second gate insulating layer 21 by the electric field formed between the control gate 23 and the floating gate 15. As a result, data are erased.

In reading data, if a predetermined voltage is applied to the bit line 27 and the control gate 23 connected with the drain area 18 of the memory cells, data can be read in accordance with the presence of the current flowing between the memory cells. At this time, if the channel area formed by the control gate 23 and the channel formed by the floating gate 15 are all made, that is, if voltage, higher than the threshold voltage, is applied to the gate, the non-volatile memory cells flow current.

In general, the select transistors of the memory cells are manufactured to have threshold voltage (Vth) of approximately 1.0V. The floating gate 15 has a high threshold voltage at the data programmed memory cells and a low threshold voltage at the data erased memory cells including −Vth sometimes. However, in case that the floating gate 15 has −Vth due to over-erasure, the select transistor having a threshold voltage of approximately 1.0V turns off the channel even if 0V is applied to the control gate 23. Therefore, there will be not problem of over-erasure any longer. In this way, even if the threshold voltage of the floating gate of the NOR type of the non-volatile semiconductor device is not strictly controlled, an operational failure (wrong operation) will not occur.

However, the floating gate pattern and the control gate pattern are simultaneously formed in a general self-aligned deposition gate type of memory cells, so that misalignment of these two patterns will not easily happen.

On the other hand, since the floating gate pattern and the control gate patterns of a conventional split gate type of memory cells are fabricated by separate processes, misalignment of these two patterns may easily happen in forming the control gate pattern. Without mismatching, the length of the select transistor gates, L1 and L2 will be the same. With mismatching, the length of the select transistor gates L1 and L2 will be different, so that there will be a tendency of showing different characteristics of memory cells in accordance with odd/even numbered word lines.

Besides, byte programming and erasing processes can not be performed due to a schematic characteristic of the memory cells. Furthermore, since one contact hole is used in each bit line, the number of contact holes of bit lines is large, which has been a factor to cause difficulty in scaling down cells.

SUMMARY OF THE INVENTION

Therefore, it is an object of the present invention to prevent mismatching of word lines, thereby not showing different characteristics of memory cells in response to with odd/even numbered word lines.

It is another object of the present invention to make it possible to perform byte programming and erasing processes.

It is a third object of the present invention to reduce the number of contact holes used at bit lines, thereby easily scaling down cells.

In order to accomplish the aforementioned objects of the present invention, there is provided a non-volatile semiconductor memory device comprising:

a first conductivity type of a semiconductor substrate having separately formed active areas and field areas formed with field insulating layers to isolate the active areas;

a first gate insulating layer formed at respective substrate of the active areas;

floating gates arranged at a predetermined interval on the first gate insulating layer;

oxide layers respectively formed at the upper surface of the floating gates;

a second gate insulating layer to be used as a tunneling insulating layer formed at lateral surfaces of the floating gates;

control gates respectively formed at the active areas of the resultant structure for getting a corresponding pair of floating gates, out of the floating gates, continuously overlapped;

a second conductivity type of source areas formed at the active area, a part of which is overlapped with the same part of the floating gates, and at a part of the neighboring active area; and a second conductivity type of buried diffusion areas formed at the substrate of a part of the field area for preventing neighboring source areas of the same source line, out of source areas, from being isolated by the field insulating layer, and for making them electrically connected.

Preferably, the buried diffusion area is formed at the substrate of the periphery of the field insulating layer formed between neighboring source areas. The field insulating layer is an insulating layer filled in the trench.

In addition, a non-volatile semiconductor memory device in accordance with another embodiment of the present invention comprises:

a first conductivity type of a semiconductor substrate having separately formed first active areas, active areas formed between the first active areas with second active areas integrally connected to parts of both sides of the first active areas and field areas formed with a field insulating layer for isolating the active areas;

first gate insulating layers respectively formed at the substrate of the first and second active areas;

floating gates arranged at the first gate insulating layer in a predetermined interval;

oxide layers respectively formed at the upper surfaces of the floating gates;

second gate insulating layers, to be used as tunneling insulating layers, formed at the lateral surfaces of the floating gates;

control gates formed at the first active areas of the resultant structure for getting a corresponding pair of floating gates, out of the floating gates, continuously overlapped; and a second conductive type of active source areas formed at the first active areas, a part of which is overlapped at the same portion of the floating gates, and at a part of the neighboring first active areas, wherein the second active areas are integrally connected between the source areas to prevent the neighboring source areas of the same source line, out of the source areas, from being isolated by the field insulating layer and to make them electrically connected.

Preferably, the second active areas are ion-implanted with a second conductive type of impurity.

The method of fabricating the non-volatile semiconductor memory device in accordance with the first embodiment of the present invention comprises the steps of:

forming a field insulating layer at a field area of the semiconductor substrate for isolating active areas of the first conductivity type of a semiconductor substrate;

forming first gate insulating layers at the active areas of the substrate;

respectively forming floating gates arranged at the first gate insulating layers in a predetermined interval and oxide layers at the upper surfaces of the floating gates;

forming a second conductivity type of source areas at the substrate of the active areas for getting a part thereof partially overlapped with the same part of the floating gates;

forming second gate insulating layers, to be used for tunneling insulating layers, at the lateral surfaces of the floating gates; and forming control gates at the active areas of the resultant structure for getting a corresponding pair of the floating gates, out of the floating gates, continuously overlapped, wherein the step of forming the field insulating layer includes the step of forming a second conductivity type of buried diffusion areas at the substrate of a part of the field areas positioned between neighboring source areas for preventing the source areas neighboring the same source line, out of all the source areas, from being isolated by the field insulating layer, and for making them electrically connected.

A method of fabricating the non-volatile semiconductor memory device in accordance with another embodiment of the present invention comprises the steps of:

forming a first active areas of a first conductivity type of semiconductor substrate and field insulating layers at the field areas of the semiconductor substrate for isolating active areas positioned between the first active areas with the second active areas integrally connected to a part of both sides of the first active areas;

respectively forming a first gate insulating layer at the substrate of the first and second active areas;

forming floating gates arranged in a predetermined interval at the first gate insulating layer and oxide layers at the upper surfaces of the floating gates;

forming a second conductivity type of source areas at the substrate of the active areas for getting a part thereof overlapped with the same parts of the floating gates;

forming a second gate insulating layer, to be used for tunneling insulating layers, at the lateral surfaces of the floating gates; and forming control gates on the first active areas of the resultant structure for getting a corresponding pair of the floating gates, out of the floating gates, continuously overlapped, wherein the second active areas are integrally connected between neighboring source areas for preventing the source areas neighboring the same source line, out of all the source areas, from being isolated by the field insulating layers, and for making them electrically connected.

Therefore, in accordance with the present invention, the control gates continuously overlap a pair of split floating gates of the active areas. As a result, even if the floating gate pattern and the control gate pattern are respectively made by separate processes, there will be no mismatching between the aforementioned two patterns. There will be no tendency of showing different characteristics of memory cells in accordance with odd/even numbered word lines.

In addition, the schematic characteristic of cells makes it possible to program and erase a byte. As one contact hole is not used at each bit line, the number of contact holes gets small, thereby making it possible to scale down cells.

DETAILED DESCRIPTION OF THE INVENTION

The non-volatile semiconductor memory device and the fabricating method thereof will be described in detail with reference to accompanying drawings.

Figure 1:
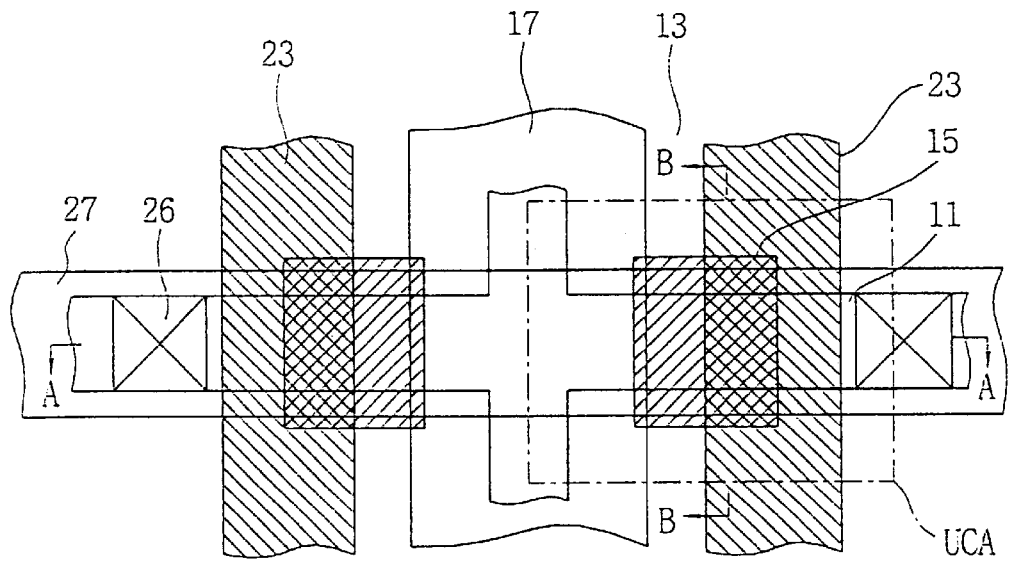
FIG. 1 is a layout diagram for illustrating a key part of a non-volatile semiconductor memory device in accordance with the prior art.
Figure 2:
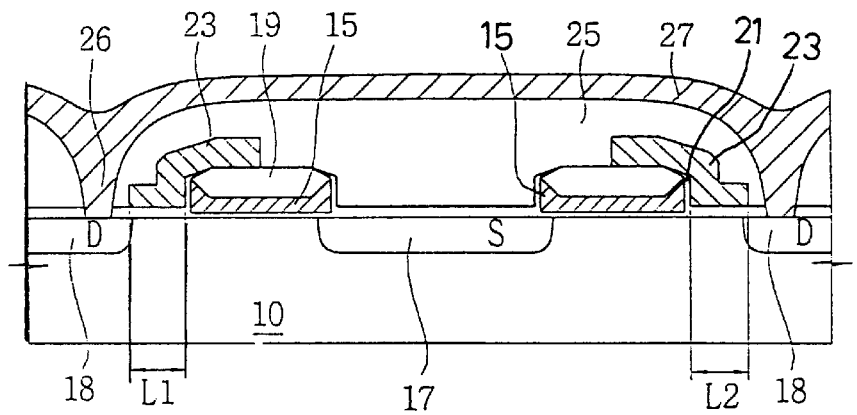
FIG. 2 is a cross-sectional diagram for illustrating a key part of a non-volatile semiconductor memory device cut down along with an A—A line in FIG. 1.
Figure 3:
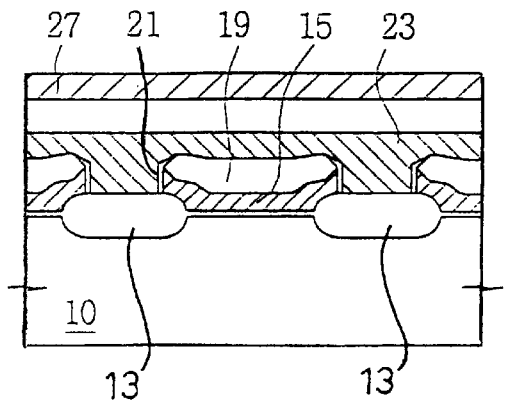
FIG. 3 is a cross-sectional diagram for illustrating a key part of a non-volatile semiconductor memory device cut down along with a B—B line in FIG. 1.
Figure 4:
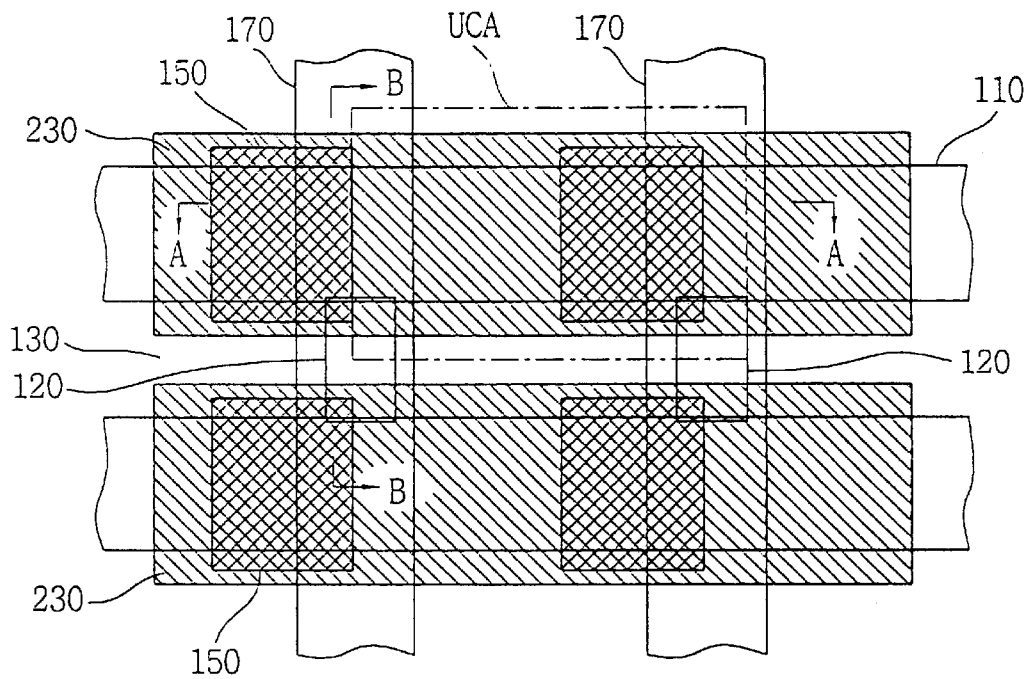
FIG. 4 is a layout diagram for illustrating a key part of a non-volatile semiconductor memory device in accordance with a first embodiment of the present invention.
Figure 5:
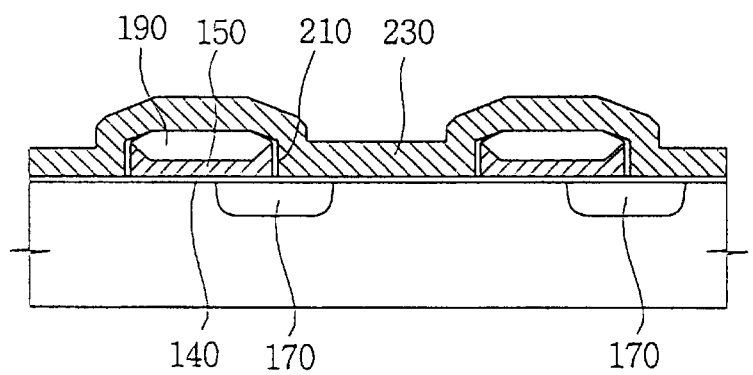
FIG. 5 is a cross-sectional diagram for illustrating a key part of a non-volatile semiconductor memory device cut down along with an A—A line in FIG. 4.
Figure 6:
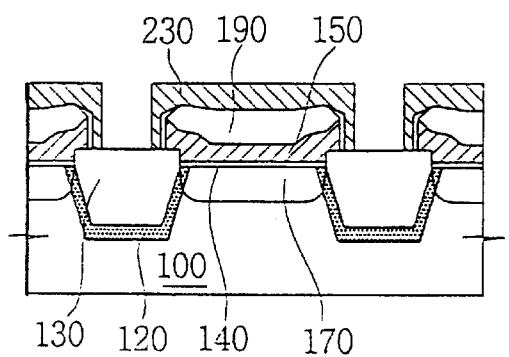
FIG. 6 is a cross-sectional diagram for illustrating a key part of a non-volatile semiconductor memory device cut down along with a B—B line in FIG. 4.

FIG. 4 is a layout diagram for illustrating a key part of a non-volatile semiconductor memory device in accordance with a first embodiment of the present invention;

FIGS. 5 and 6 are cross-sectional diagrams for illustrating parts of a non-volatile semiconductor memory device cut down along with A—A and B—B lines in FIG. 4.

The first embodiment of the present invention will be conveniently described in relation with FIGS. 4 through 6.

As shown in FIGS. 4 through 6, the non-volatile semi-conductor device of the first embodiment of the present invention includes active areas 110 arranged at a predetermined interval, shown as horizontally lined patterns, and a field insulating layer 130 formed at the field area for shallow trench isolation of active areas. Respective floating gates are separately arranged at the first gate insulating layer 140 of the related active areas 110. Respective source lines are separately arranged at the semiconductor substrate 100, shown as vertically lined patterns which cross the active areas 110 perpendicularly, and a part of source areas 170 of each source line is overlapped with the same part of the corresponding floating gates 150. Oxide layers 190 are respectively arranged at the floating gates 150. Second gate insulating layers 210 are formed at the lateral surfaces of the floating gates 150 to be used as tunneling insulating layers in erasing data. Control gates 230 arranged at the oxide layers 190, the second gate insulating layers 210 and the first gate insulating layer 140 of the active areas 110 for getting a corresponding pair of floating gates 150 continuously overlapped in a pattern of islands. In order to prevent source areas 170 neighboring the same source line from becoming electrically disconnected by the field insulating layer 130, a high concentration of buried diffusion areas 120 are formed at the substrate 100 around the field insulating layer 130 positioned between the source areas 170.

On the other hand, even if only a pair of floating gates corresponding to an active area 110 are shown in the drawings for convenient description, it should be taken for granted that a number of pairs of floating gates are repeatedly arranged correspondingly to the active areas 110 in actuality.

The method of fabricating the non-volatile semiconductor memory device thus constructed will be described with reference to FIGS. 7 through 15.

FIGS. 7 through 15 are cross-sectional diagrams for illustrating the fabricating procedure of a non-volatile semiconductor memory device in accordance with the first embodiment of the present invention. For convenient description, there will be crosssectional process diagrams respectively cut along the A—A and B—B lines of FIG. 4 in terms of the unit cell area in all the drawings of FIGS. 7 through 15.

Figure 7:
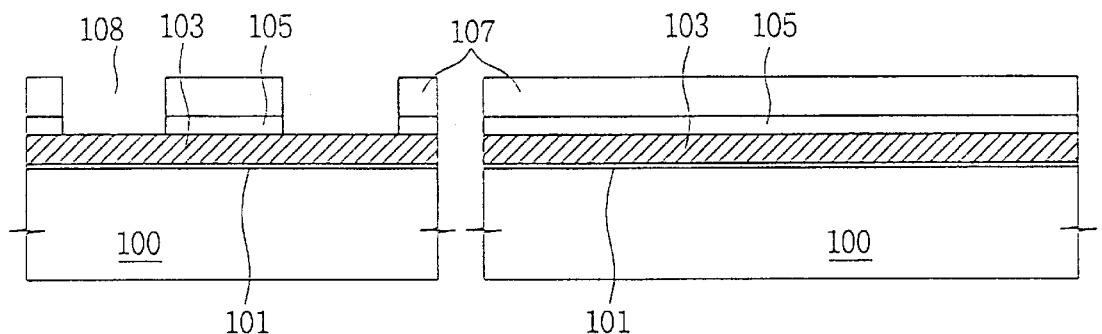
FIGS. 7 through 15 are cross-sectional process diagrams for illustrating the procedure of fabricating a nonvolatile semiconductor memory device in accordance with a first embodiment of the present invention.

As shown in FIG. 7, first of all, a multi-layered structure for shallow trench isolation is formed all over the surface of the first conductivity type of a semiconductor substrate 100, that is, a P type of a silicon substrate. In other words, a pad oxide layer 101 is formed at the surface of the semiconductor substrate 100 in thickness of about 500 angstrom (hereinafter, A). A first nitride layer 103 is deposited at the pad oxide layer 101 in thickness of about 4000 A. Then, an insulating layer, for example, a high temperature oxide layer 105, to be used as a mask for etching trenches is deposited at the first nitride layer 103 in thickness of about 2000 A.

Next, in order to restrict the active areas 110 of the horizontally lined pattern, as shown in FIG. 4, a photo resist layer pattern 107, where windows 108 will be positioned in the field area of the substrate 100, is formed at the high temperature oxide layer 105 of the active areas 110.

Furthermore, the photo resist layer pattern 107 is used as a mask for etching the high temperature oxide layer 105 exposed in the windows 108 to thereby expose the surface of the first nitride layer 105.

Figure 8:
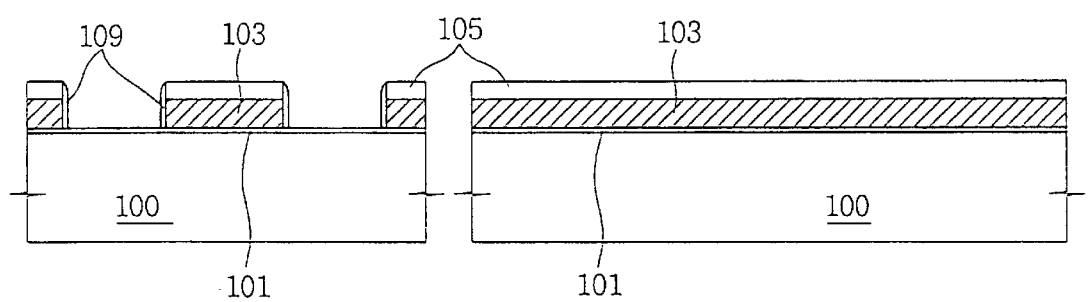

As shown in FIG. 8, the photo resist layer pattern 107 shown in FIG. 7 is eliminated, and, then, the remaining high temperature oxide layer 105 is used as a mask for etching the exposed portion of the first nitride layer 103 to thereby expose the surface of the pad oxide layer 101.

Then, in order to reduce a damage upon the gate insulating layer of the memory cell transistor, an insulating layer is deposited for forming spacers 109 in the resultant structure of the substrate 100, which will be further etched to expose the surface of the semiconductor substrate 100 of the field area, thereby forming the spacers 109 of the insulating layer at the lateral surfaces of the high temperature oxide layer 105 and the first nitride layer 103.

Figure 9:
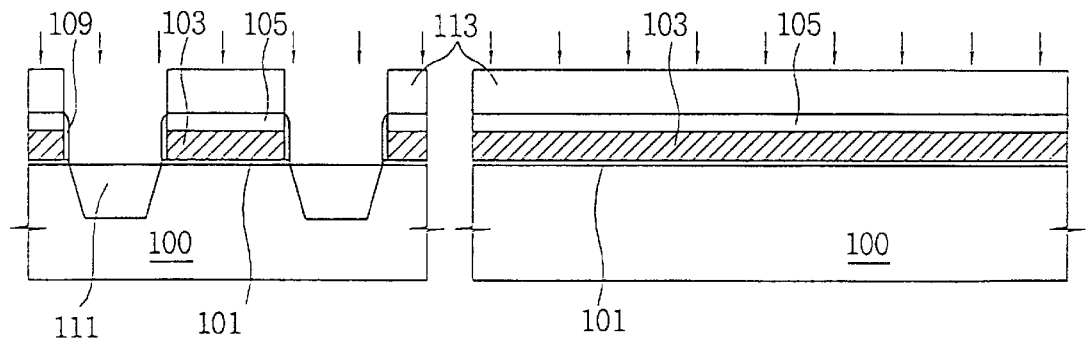

As shown in FIG. 9, the high temperature oxide layer 105 is used as a mask for etching the exposed portion of the pad oxide layer 101 to isolate the shallow trenches, and the semiconductor substrate 100 thereunder is also etched in a desired depth to form trenches 111 in the substrate 100 of the field area. At this time, a great deal of etching damage may be made upon the etched surfaces of trenches 111, which will reduce device characteristics including transistor, isolation and the like due to the following oxidation and impurity implantation processes.

Buried diffusion areas 120, as shown in FIG. 6, are next formed in the substrate surrounding the trenches 111 to electrically connect neighboring source areas 170 across the region of the field insulating layer 130. The buried diffusion areas 120 prevent the neighboring source areas 170 from being electrically discontinued by the field insulating layer 130. With reference to FIG. 9, a photo resist layer 113 pattern having windows which are positioned at the trenches 111 between the source areas 170 is formed on the high temperature oxide layer 105. The photo resist layer 113 is used as a mask for ion-implanting second conductivity N type impurities, such as phosphorus, at a high concentration into the substrate 100 of the trenches 111.

Figure 10:
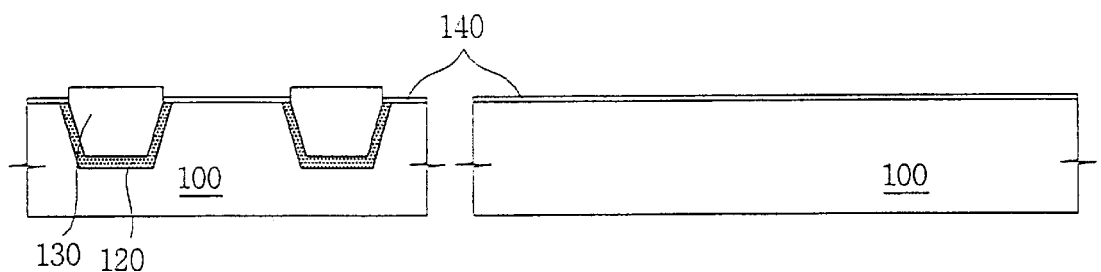

As shown in FIG. 10, the photo resist layer 113 of FIG. 9 is eliminated to perform a thermal process on the ion-implanted N type impurity ions to form buried diffusion areas 120 in the substrate 100 surrounding the trenches 111. Therefore, the neighboring field areas 170, which will be formed at the active areas 110 of the respective source lines, will not be discontinued by the field insulating layer 130, thereby making them 170 electrically connected.

Then, a linear insulating layer (not shown) is further deposited at the spacers 109, the high temperature oxide layer 105 and the trenches 111 by a chemical vapor deposition process.

At this time, the linear insulating layer can be made in a deposition structure of a nitride layer in thickness of about 2000 A and a medium temperature of an oxide layer in thickness of about 200 A.

Then, a field insulating layer 130 thick enough to completely fill the trenches 111 is deposited at the line type of the insulating layer. Preferably, the field insulating layer 130 can be made in a deposition structure of an undoped silicate glass (USG) layer and PE-TEOS (plasma enhanced tetraethyorthosilicate) oxide layer.

Furthermore, etch back process and CMP (chemical mechanical polishing) process are used for completely eliminating the field insulating layer 130, the line type of the insulating layer, the high temperature oxide layer 105 and the first nitride layer 103 of the active area 110, thereby making the pad oxide layer 101 of the field insulating layer 130 even with the active area 110 of the trench 111.

Then, the remaining pad oxide layer 101 is etched to expose the substrate 100 of the active area 110 thereunder, and a first gate insulating layer 140, for instance, a thin thermal oxide layer grows in thickness of 60–150 A at the substrate 100 of the exposed active area.

Figure 11:
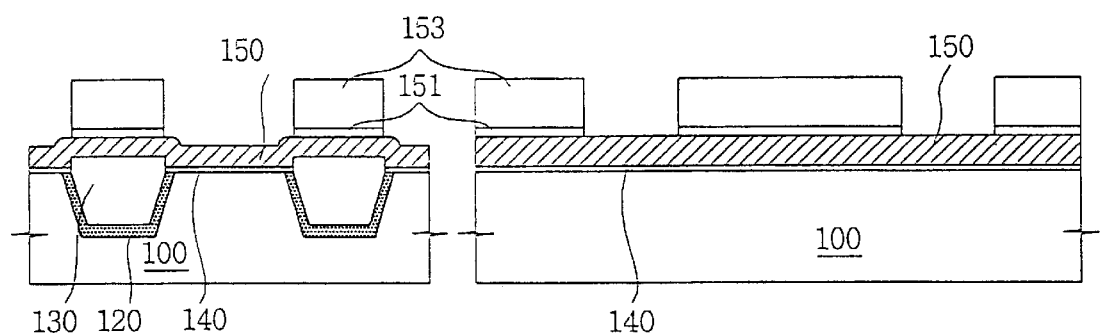
Figure 12:
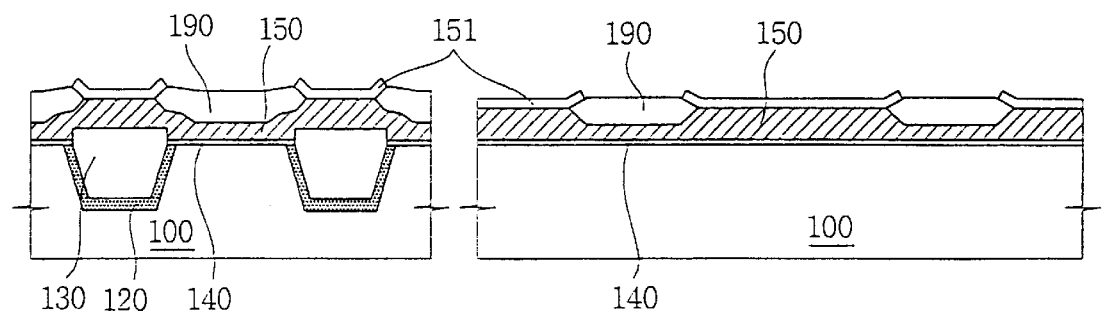

As shown in FIG. 11, a conductivity layer, for instance, a doped polysilicon layer 150, is deposited for floating gates of the field insulating layer 130 and the first gate insulating layer 140 in thickness of 1000–2000 A. As shown in FIG. 12, a second nitride layer 151 is deposited at the polysilicon layer 150 in thickness of 200–2000 A to be further used for an oxide mask of the polysilicon layer 150 to form an oxide layer 190.

An annealing process is used for forming the polysilicon layer 150 in a recrystallized silicon or almost singly crystallized silicon. At this time, the annealing process does not need to be carried out until the singly crystallized silicon is made.

Then, a photo-resist layer 153 pattern, where windows are positioned at the second nitride layer 151 of the area for a pair of corresponding floating gates 150, as shown in FIG. 4, is formed at the second nitride layer 151. The photo resist layer pattern is used as a mask for etching the exposed portion of the second nitride layer 151, to thereby expose the polysislicon layer 150 thereunder.

As shown in FIG. 12, the photo resist layer pattern 153 of FIG. 11 is eliminated, and the remaining second nitride layer pattern 151 is used as a mask for performing an oxidation process upon a portion of the thickness of the polysilicon layer 150 to form an oxide layer 190, for instance, in thickness of 1000–2000 A at the polysilicon layer 150 of the area for the floating gates. At this time, it should be taken for granted that the polysilicon layer 150 formed under the oxide layer 190 is made in thickness to maintain the thickness of the floating gate.

Figure 13:
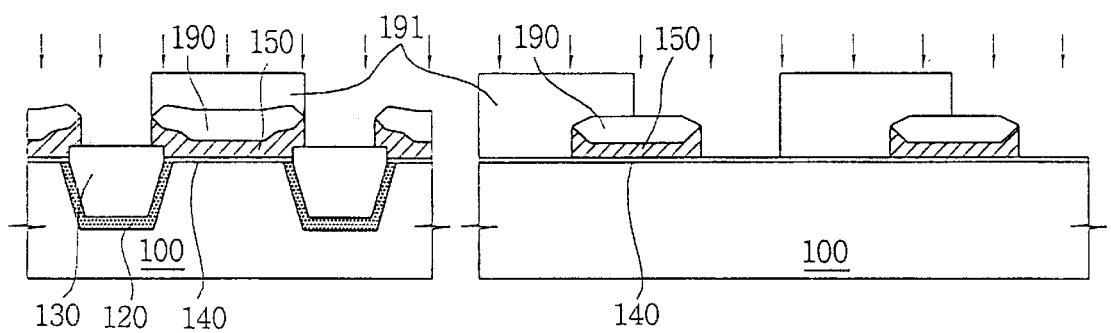

As described in FIG. 13, the remaining nitride layer 151 of FIG. 12 is eliminated to expose the polysilicon layer 150 thereunder. Then, the oxide layer 190 is used as a mask for etching the exposed portion of the polysilicon layer 150 to thereby expose the first gate insulating layer 140 thereunder and the field insulating layer 130 of the field area altogether. Therefore, the floating gate 150 is formed under the oxide layer 190 in self-alignment.

On the other hand, even if only a pair of floating gates corresponding to an active area 110 are shown in the drawings for convenient description, it should be taken for granted that a number of pairs of floating gates are repeatedly arranged correspondingly to the active areas 110 in actuality.

Furthermore, as shown in FIG. 4, in order to restrict the source areas 170 of the source line, which are positioned in perpendicular to the length of the active area 110 and a part of which are overlapped with a portion of the floating gate 150, a photo resist layer pattern 191 having a window related to the source line is formed at the structure thus constructed.

Then, the photo resist layer pattern 191 is used as a mask for ion-implanting a high concentration of N type impurity onto the substrate 100 of the area for the source line.

Figure 14:
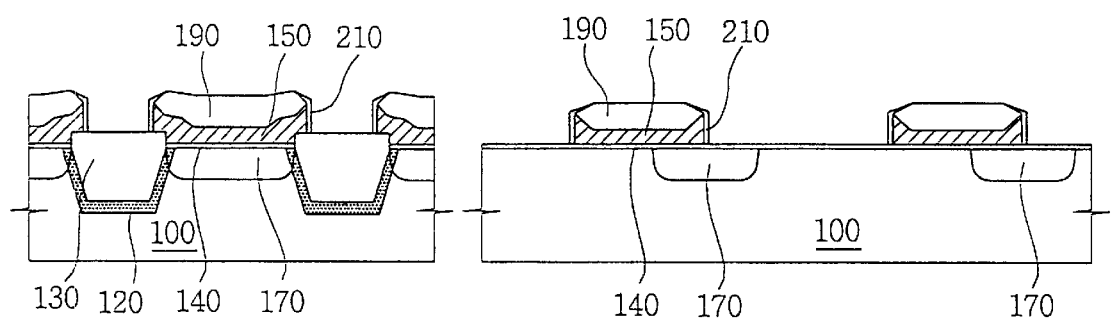

As shown in FIG. 14, after the photo resist layer pattern 191 is eliminated, a thermal process is performed upon the ion-implanted impurity to form a source area 170 of the source line at the active area 110, a part of which is overlapped with a portion of the floating gate 150, and at a portion of the neighboring active areas 110.

Then, in order to achieve insulation between the floating gate 150 and the polysilicon layer 230, formed for the control gate 230 shown in FIG. 4, and use as a tunneling insulating layer in erasing data, a second gate insulating layer 210 is formed at the lateral surfaces of the floating gate 150. For a little detailed description, the second gate insulating layer 210, for instance, a thin oxide layer grows in thickness of 200–400 Angstrom at the lateral surfaces of the floating gate 150 and a thermal annealing process is performed to the oxide layer with carrier gas, that is, Nitrogen or Argon mixed nitrogen at a high temperature.

Figure 15:
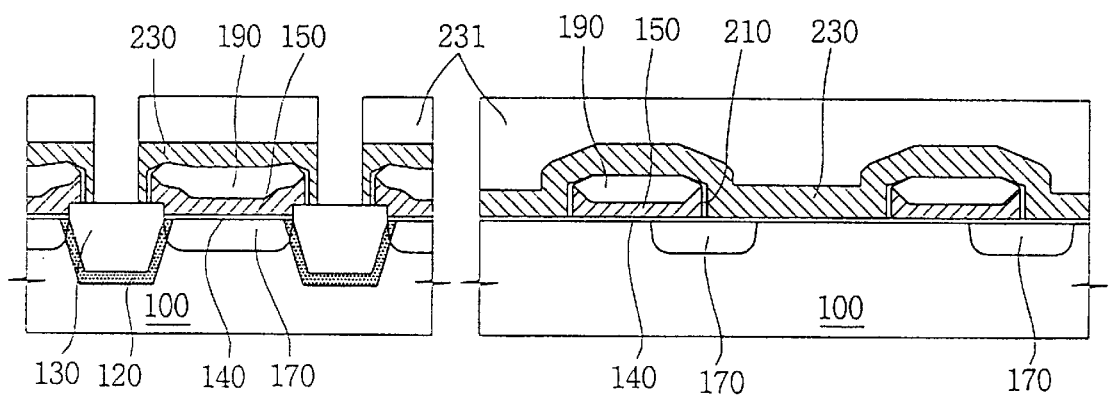

At this time, at the same portion of the floating gate 150, the second gate insulating layer 210 can be also used as a gate insulating layer of a select transistor by the control gate 230 shown in FIG. 15.

As shown in FIG. 15, a conductivity layer, for instance, a doped polysilicon layer 230, is deposited in a predetermined thickness to be used for the gate electrode of the control gate and the select transistor thus constructed. A polycide layer can be also used for the polysilicon layer 230.

A photo resist layer pattern 231 is formed at the polysilicon layer of the area for the control gate shown in FIG. 4, and the photo resist layer pattern 231 is used as a mask for etching the exposed portion of the polysilicon layer 230 to thereby expose the field insulating layer 130 thereunder. Therefore, in order to get the control gate 230 continuously overlapped with a corresponding pair of floating gates 150, the control gate 230 is arranged in a pattern of islands at the oxide layer 190, the second gate insulating layer 210 and the first gate insulating layer 140 of the respective active areas 110.

At this time, since the control gates 230 are continuously overlapped in series at a corresponding pair of the split floating gates 150, even if the floating gate pattern and the control gate patterns are formed by separate processes, there will be no mismatching of these two patterns. Therefore, there will be no tendency of showing different characteristics of memory cells in accordance with odd/even numbered word lines.

Furthermore, the photo resist layer pattern 231 is eliminated to form a structure constructed in FIGS. 4, 5 and 6, and, then, conventional processes will be performed to deposited insulation interlayer on the structure thus constructed and to form a contact hole of a drain area (not shown). Finally, a pattern of bit lines (not shown) is formed at the drain area of the structure thus constructed for electrical connection.

Figure 16:
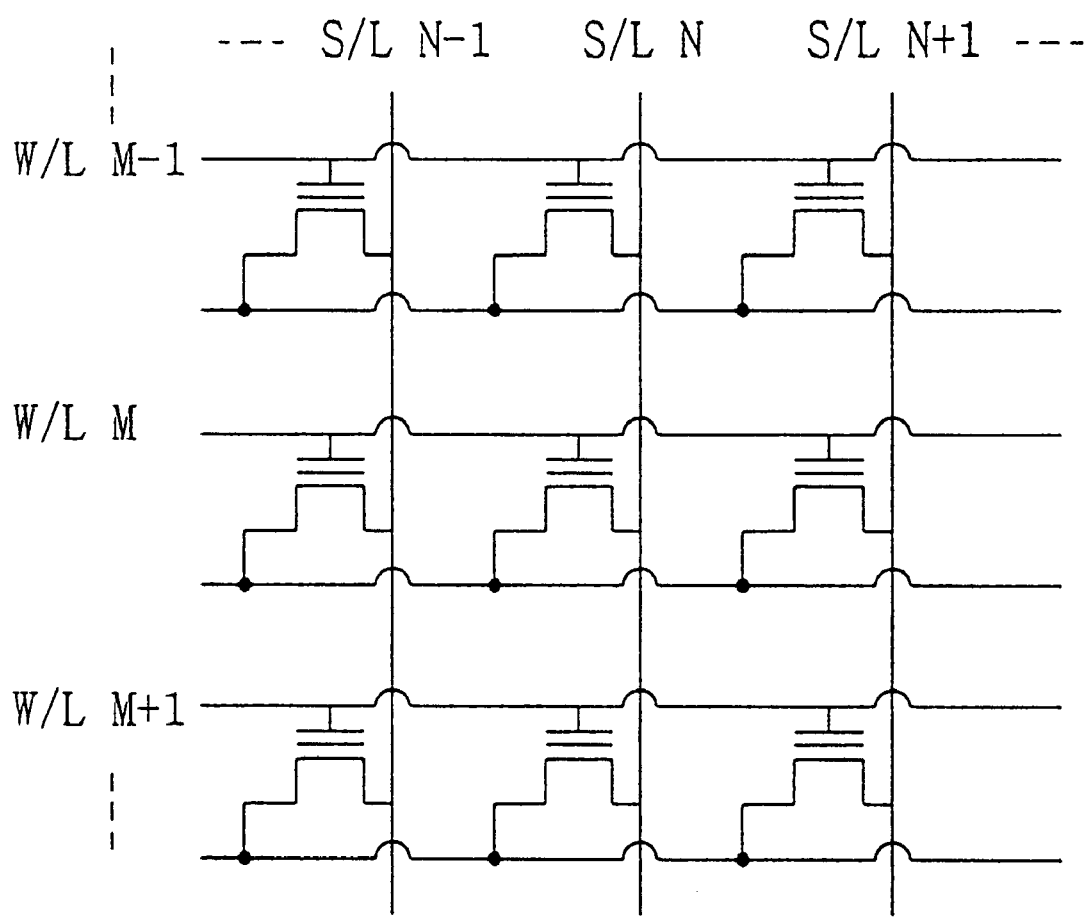
FIG. 16 is a circuit diagram for illustrating a memory cell array of the present invention.

Processes of the non-volatile semiconductor memory device thus constructed will be described with reference to FIG. 16.

At first, in programming data in accordance with the same SSI (source side injection) method, conditions to program a predetermined M-N memory cell, positioned at a Mth word line (W/L) and a Nth source line (S/L), are: to apply a high voltage Vpp1 to the Nth source line (S/L$_N$); to ground the remaining N−1th source line (S/L$_{N-1}$); and to float the remaining source lines. At the same time, approximately a threshold voltage (Vth) of a select transistor is applied to the predetermined Mth word line (W/L$_N$), and the rest of not-selected word lines are grounded. At this time, a high voltage Vpp1 is a certain level of voltage to generate channel hot electrons between the source lines (S/LN)(S/LN−1), to thereby implant ions by a coupling process to the floating gate.

Current does not flow at channels of not-selected word lines. The current route is set from the N−1th source line through an active channel formed under the selected word line to the Nth source line. As a result, only M-N memory cell is programmed.

On the other hand, if source lines (S/L$_{N1}$), (S/L$_N$−1) are made into a pair to select a 8 bit source line, a byte cell is programmed.

In erasing M-N memory cells, a high voltage is applied to the selected Mth word line, and the rest of not-selected word lines are grounded. At the same time, if the selected Nth source line is grounded and a predetermined voltage (0−Vpp) is applied to not-selected source lines, the not-selected cells of the selected word line turns down under the F-N tunneling voltage from the floating gate to word line, thereby not performing the F-N erasure, but erasing only one M-N memory cell.

On the other hand, in order to erase a byte, a high voltage (Vpp2) is simultaneously applied to the word line, the pre-selected 8 bit source lines (S/L$_N$)(S/L$_{N-1}$) made into a pair are grounded, and a predetermined voltage (0−Vpp2) is applied to the rest of source lines where F-N erasure does not happen, to thereby erase the pre-selected byte cell. At this time, the high voltage (Vpp2) is a certain level of voltage to perform a F-N tunneling process from the floating gate through the second gate insulating layer to the word line.

In reading M-N memory cell, the N−1th source line becomes a bit line in the actual procedure of the M-N memory cell. In other words, one more line is simultaneously used, changing into a source line or a bit line. In reading the M-N memory cell, the Nth source line is grounded, and a threshold voltage (Vth) of the select transistor (Vcc) is applied to the Mth word line. Half of the select transistor (Vcc) is applied to the N−1th source line. The current of the M-N memory cell is determined according to the amount of electrons charged into the M-N cell. Therefore, the amount of the current at the transistor of the M-N memory cell is determined in accordance with the threshold voltage (programming/ erasing state), thereby resulting in the on/off state.

According to the present invention, as the control gate continuously overlaps a pair of split floating gates of the active area, even if the floating gate and control gate patterns are formed by separate processes, the mismatching of these two patterns hardly happen. As a result, there will be no tendency of showing different cell characteristics in accordance with the odd/even numbered word lines.

In addition, the schematic characteristic of memory cells makes it possible to program and erase a byte. Furthermore, as one contact hole is not used at each bit line, the number of contact holes at bit lines gets small, thereby making it possible to scale down cells.

The non-volatile semiconductor memory device and the fabricating method thereof will be described in accordance with a second embodiment of the present invention. The same reference numerals will be used for the identical portions of the first embodiment of the present invention.

Figure 17:
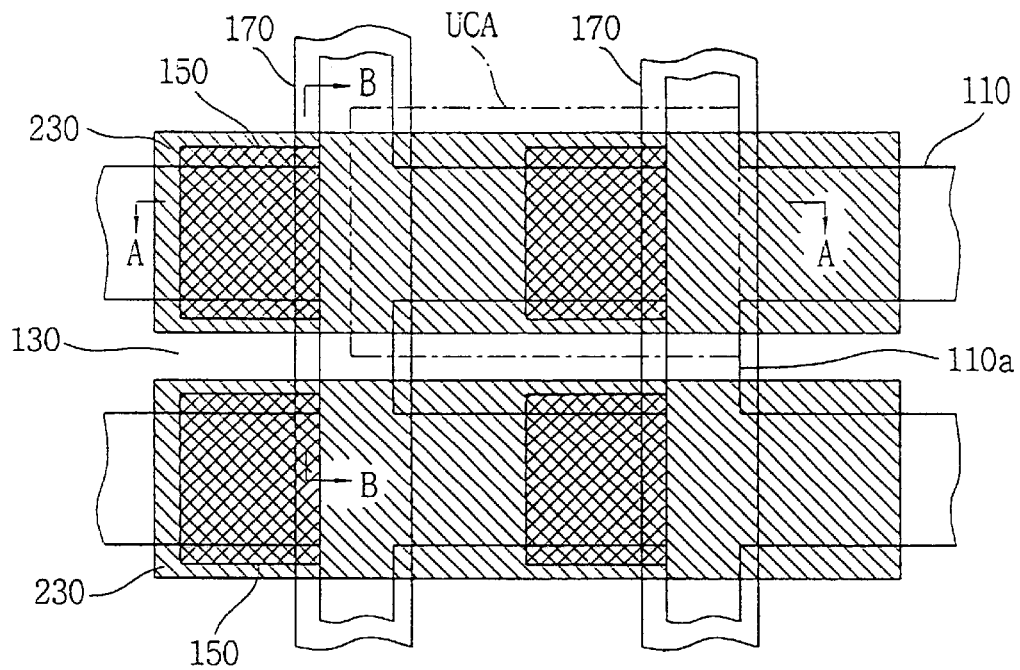
FIG. 17 is a layout diagram for illustrating a key part of a non-volatile semiconductor memory device in accordance with a second embodiment of the present invention.
Figure 18:
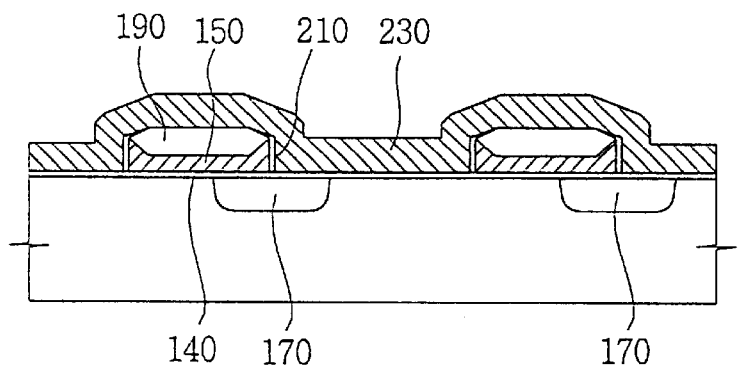
FIG. 18 is a cross-sectional diagram for illustrating a key part of a non-volatile semiconductor memory device cut down along with an A—A line in FIG. 17.
Figure 19:
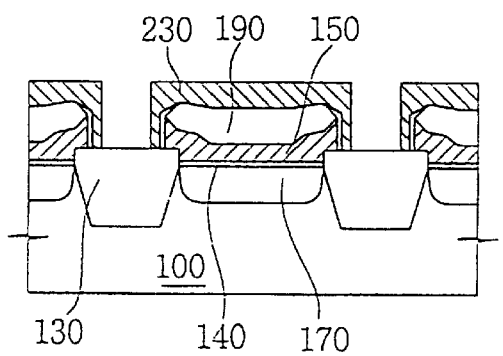
FIG. 19 is a cross-sectional diagram for illustrating a key part of a non-volatile semiconductor memory device cut down along with a B—B line in FIG. 17.

FIG. 17 is a layout diagram for illustrating a non-volatile semiconductor memory device in accordance with the second embodiment of the present invention;

FIGS. 18 and 19 are cross-sectional diagrams for illustrating parts of a non-volatile semiconductor memory device cut down along with A—A and B—B lines in FIG. 17. the second embodiment of the present invention will be conveniently described in relation with FIGS. 18 and 19.

In contrast to the first embodiment of the present invention in which neighboring source areas were connected by buried diffusion areas 120 in the trenches 111, according to the second embodiment active areas 100*a* are integrally connected to both sides of the active areas 110.

In other words, the active areas 110 are aligned at a predetermined interval, showing a horizontally lined pattern, and the active areas 110*a* are integrally connected to both sides of the active areas 110 without getting the floating gates overlapped between the neighboring source areas 170 of respective source line. A field insulating layer 130 is formed at the field area for shallow trench isolation of active areas 110, 110*a*. Respective floating gates 150 are separately aligned on the first gate insulating layer 140 of the related active areas 110. Respective source lines are separately aligned in the semiconductor substrate 100, showing a vertically lined pattern which crosses the active areas 110 in perpendicular and completely overlaps the active area 110*a*, and a part of the source areas 170 of each source line is overlapped with the same part of the corresponding floating gates 150. Oxide layers 190 are respectively aligned on the floating gates 150. Second gate insulating layers 210 are formed at lateral surfaces of the floating gates 150 as tunneling insulating layers for erasing data. Control gates 230 aligned on the oxide layers 190, the second gate insulating layers 210 and the first gate insulating layer 140 of the active areas 110 for continuously overlapping a corresponding pair of floating gates 150, showing a pattern of islands.

On the other hand, even if only a pair of floating gates corresponding to an active area 110 are shown in the drawings for convenient description, it should be taken for granted that a number of pairs of floating gates are repeatedly arranged correspondingly to the active areas 110 in actuality.

The method of fabricating the non-volatile semiconductor memory device thus constructed in accordance with the second embodiment of the present invention will be described with reference to FIGS. 20 through 26.

FIGS. 20 through 26 are cross-sectional process diagrams which illustrate a process for fabricating a non-volatile semiconductor memory device in accordance with the second embodiment of the present invention. FIGS. 20 through 26 represent cuts along the A—A and B—B lines of FIG. 4.

Figure 20:
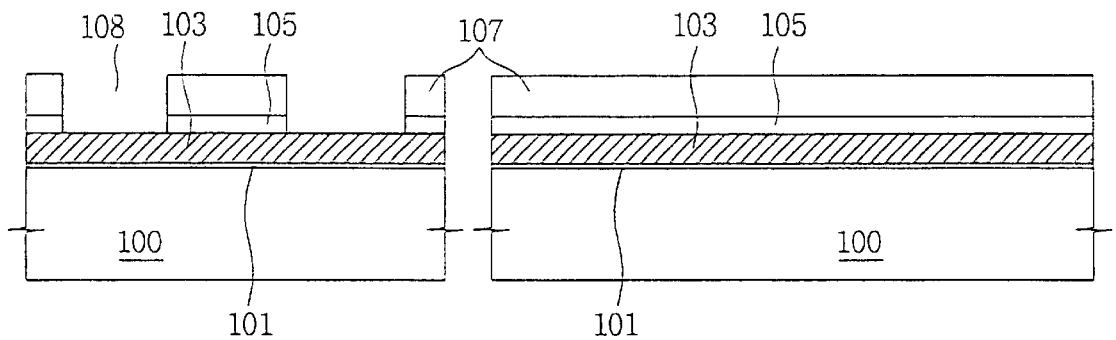
FIGS. 20 through 26 are cross-sectional process diagrams for illustrating the procedure of fabric ting a non-volatile semiconductor memory device in accordance with another embodiment of the present invention.

As shown in FIG. 20, first of all, the same process shown in FIG. 7 is performed to form a multiply layered structure for shallow trench isolation all over the surface of the first conductivity type of a semiconductor substrate 100, that is, a P type silicon substrate. In other words, a pad oxide layer 101 is formed at the surface of the semiconductor substrate 100 in thickness of about 500 A. A first nitride layer 103 is deposited at the pad oxide layer 101 in thickness of about 4000 A. Then, an insulating layer, for example, a high temperature oxide layer 105, to be used as a mask for etching trenches is deposited at the first nitride layer 103 in thickness of about 2000 A.

Next, in order to restrict the active areas 110*a* integrally connected to the active areas 110 of the horizontally lined pattern as shown in FIG. 17 and a portion of both sides of neighboring active areas 110, a photo resist layer pattern 107 having windows 108 positioned in the field area of the substrate 100 is formed at the high temperature oxide layer 105 of the active areas 110, 110*a*.

Furthermore, the photo resist layer pattern 107 is used as a mask for etching the high temperature oxide layer 105 exposed in the windows 108 to thereby expose the surface of the first nitride layer 103.

Figure 21:
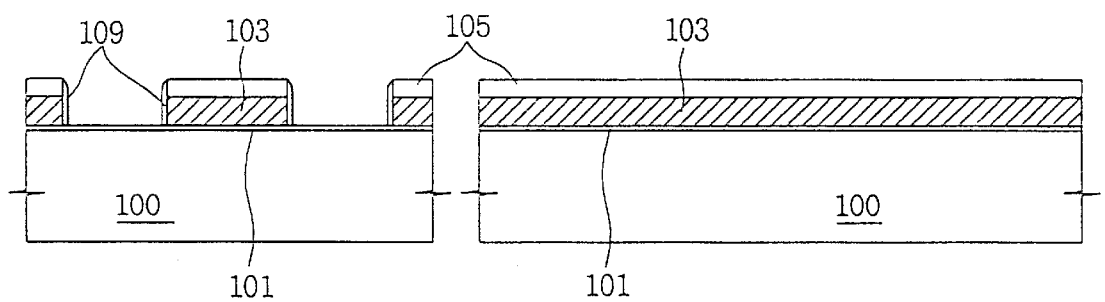

As shown in FIG. 21, the photo resist layer pattern 107 in FIG. 20 is eliminated, and, then, the remaining high temperature oxide layer 105 is used as a mask for etching the exposed area of the first nitride layer 103 to thereby expose the surface of the pad oxide layer 101.

Then, in order to reduce a damage upon the gate insulating layer of the memory cell transistor, an insulating layer is deposited for forming spacers 109 in the resultant structure of the substrate 100, which will be etched back to get the surface of the semiconductor substrate 100 of the field area to thereby deposited the spacers 109 of the insulating layer at the lateral surfaces of the high temperature oxide layer 105 and the first nitride layer 103.

Figure 22:
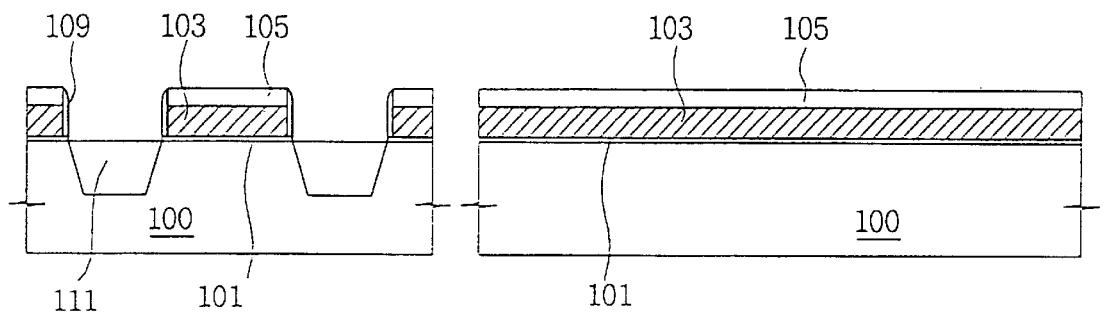

As shown in FIG. 22, the high temperature oxide layer 105 is used as a mask for etching the exposed portion of the pad oxide layer 101 to isolate the shallow trenches, and the semiconductor substrate 100 thereunder is also etched in a desired depth to form trenches 111 in the substrate 100 of the field area. At this time, the semiconductor substrate 100 of the field area is etched in a desired depth to form trenches in the substrate of the field area.

In the first embodiment of the present invention, in order to prevent the neighboring source areas 170, which will be formed at the active area 110 of the respective source line, from being electrically discontinued by the field insulating layer 130, but to get these source areas electrically connected, a photo resist layer pattern 113 having windows positioned on the trenches 111 positioned between the source areas 170 is formed at the high temperature oxide layer 105, which will be used as a mask for ion-implanting the second conductivity type of N type impurity, phosphorus, onto the substrate 100 of the trenches 111 at a high concentration to form the buried diffusion area 130. However, these processes can be omitted in the second embodiment of the present invention. As shown in FIG. 17, it is because both sides of the source areas 170 are integrally connected by the active areas 110.

Figure 23:
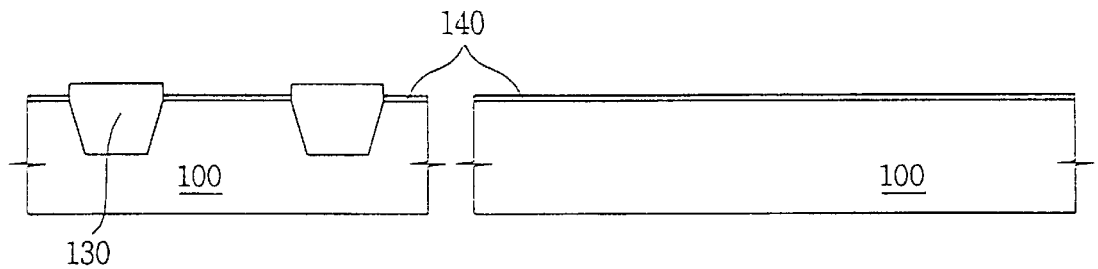

As shown in FIG. 23, a linear insulating layer (not shown) is further deposited at the spacers 109, the high temperature oxide layer 105 and the trenches 111 by a chemical vapor deposition process. The line type of the insulating layer (not shown) is formed for reducing an etching damage upon the surfaces of etching trenches in the substrate 100, thereby restricting reduction of device characteristics including transistor and isolation due to the following oxidation and impurity.

At this time, the line type of the insulating layer can be made in a deposition structure of a nitride layer in thickness of about 2000 A and a medium temperature of an oxide layer in thickness of about 200 A.

Then, a field insulating layer 130 thick enough to completely fill the trenches 111 is deposited at the line type of the insulating layer. Preferably, the field insulating layer 130 can be made in a deposition structure of an undoped silicate glass layer and PE-TEOS (plasma enhanced tetraethyorthosilicate) oxide layer.

Furthermore, an etch back process and a CMP (chemical mechanical polishing) process are used for completely etching the field insulating layer 130, the line type of the insulating layer, the high temperature oxide layer 105 and the first nitride layer 103 of the active area 110 to make even the field insulating layer 130 of the trenches 111 and the pad oxide layer 101 of the active area 110.

Then, the remaining pad oxide layer 101 is etched to expose the substrate 100 of the active area 1 10 thereunder, and a thin first gate insulating layer 140 is formed at the substrate 100 of the exposed active area 110.

Figure 24:
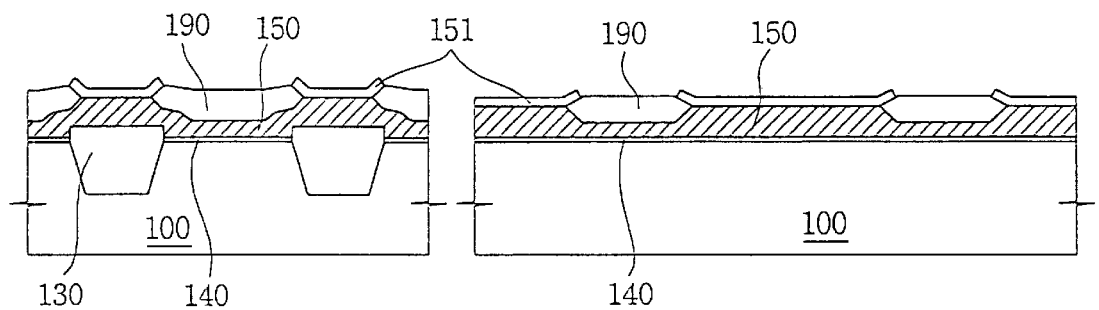

As shown in FIG. 24, the same processes shown in FIGS. 11 and 12 are performed. In other words, a conductivity layer, for instance, a doped polysilicon layer 150, is deposited for floating gates of the field insulating layer 130 and the first gate insulating layer 140 in thickness of 1000–2000 A. A second nitride layer pattern 151 is deposited at the polysilicon layer 150 of the areas except an area where floating gates are formed, to be used as an oxidation mask of the polysilicon layer 150 for forming an oxide layer 190. The second nitride layer pattern 151 is used as a mask for performing an oxidation to a portion of the thickness of the polysilicon layer 150 to thereby form an oxide layer 190 on the polysilicon layer 150 of the area, where the floating gates are formed, in thickness of 1000–2000 A. At this time, it is taken for granted that the polysilicon layer 150 formed under the oxide layer 190 is made in thickness to maintain the thickness of the floating gate.

Figure 25:
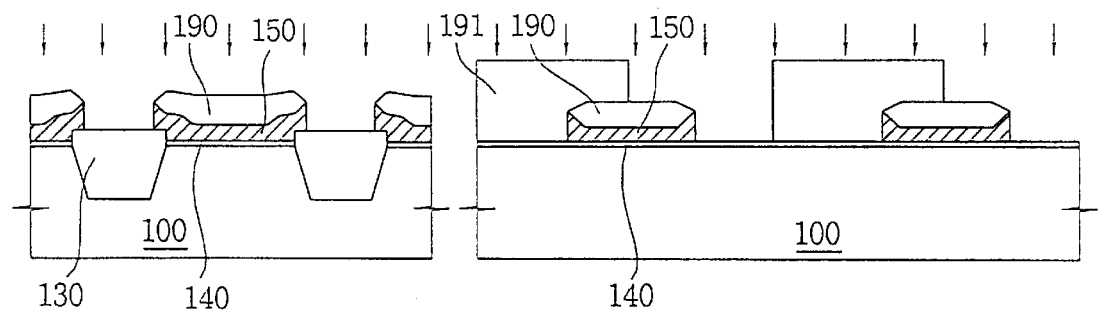

As shown in FIG. 25, the remaining nitride layer 151 in FIG. 24 is eliminated to expose the polysilicon layer 150 thereunder. Then, the oxide layer 190 is used as a mask for etching the exposed portion of the polysilicon layer 150 to expose the first gate insulating layer 140 thereunder and the field insulating layer 130 of the field area together. Therefore, floating gate 150 is formed under the oxide layer 190 in self-alignment.

On the other hand, even if only a pair of floating gates corresponding to an active area 110 are shown in the drawings for convenient description, it should be taken for granted that a number of pairs of floating gates are repeatedly arranged correspondingly to the active areas 110 in actuality.

Furthermore, as shown in FIG. 17, in order to restrict the source area 170 of the respective source line, which are positioned in perpendicular to the length of the active area 110 and a part of which are overlapped with a portion of the floating gate 150, a photo resist layer pattern 191 having a window related to the source line is formed at the structure thus constructed.

Then, the photo resist layer pattern 191 is used as a mask for ion-implanting a high concentration of N type impurity onto the substrate 100 of the area for the source line.

Figure 26:
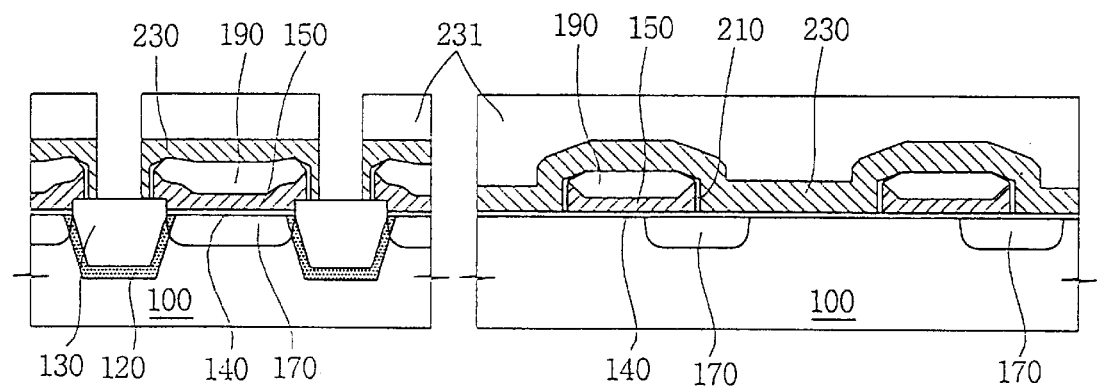

As shown in FIG. 26, after the photo resist layer pattern 191 in FIG. 25 is eliminated to perform a thermal process to the ion-implanted impurity to form a source area 170 of the source line at the active area 110 a part of which is overlapped with a portion of the floating gate 150 and at a portion of the neighboring active area 110.

Then, in order to achieve insulation between the floating gate 150 and the polysilicon layer 230, formed for the control gate 230 shown in FIG. 17, and use as a tunneling insulating layer in erasing data, a second gate insulating layer 210 is formed at the lateral surfaces of the floating gate 150.

A conductivity layer, for instance, a doped polysilicon layer 230, is deposited in a predetermined thickness to be used for a gate electrode of the control gate and the select transistor thus constructed. A polycide layer can be also used for the polysilicon layer 230.

A photo resist layer pattern 231 is formed at the polysilicon layer 230 of the area for the control gate shown in FIG. 17, and the photo resist layer pattern 231 is used as a mask for etching the exposed portion of the polysilicon layer 230 to expose the field insulating layer 130 thereunder. Therefore, in order to get the control gate 230 continuously overlapped with a corresponding pair of floating gates 150, the control gate 230 is arranged on the oxide layer 190, the second gate insulating layer 210 and the first gate insulating layer 140 of the respective active area 110 in a pattern of islands.

At this time, as the control gate 230 is continuously overlapped in series at a corresponding pair of the split floating gates 150, even if the floating gate pattern and the control gate patterns are formed by separate processes, there will be no mismatching of these two patterns. Therefore, there will be no tendency of showing different characteristics of memory cells in accordance with odd/even numbered word lines.

Furthermore, the photo resist layer pattern 231 is eliminated to form a structure constructed in FIGS. 17, 18 and 19, and, then, conventional processes will be performed to deposit an insulation interlayer on the structure thus constructed and form a contact hole of a drain area (not shown). Finally, a pattern of bit lines (not shown) is formed at the drain area of the structure thus constructed for electrical connection.

Processes of the non-volatile semiconductor memory device thus constructed in accordance with the second embodiment of the present invention will be the same as those of the device constructed in accordance with the first embodiment of the present invention, so that the repeated description will be omitted.

As described above, there are an advantage in the non-volatile semiconductor memory device of the present invention in that, as the control gate continuously overlaps a pair of split floating gates of the active area, even if the floating gate and control gate patterns are formed by separate processes, the mismatching of these two patterns hardly happen, thereby resulting in no tendency of showing different cell characteristics in accordance with the odd/even numbered word lines.

In addition, there are further advantages in the non-volatile semiconductor memory device of the present invention in that the schematic characteristic of cells makes it possible to program and erase a byte, and, as one contact hole is not used for each bit line, the number of contact holes in bit lines is small to thereby make it possible to scale down cells.

While the invention has been described in terms of preferred embodiments shown in the accompanying drawings, those skilled in the art will recognize that the invention can be practiced with modification within the spirit and scope of the appended claims.

What is claimed is:

1. A non-volatile semiconductor memory device comprising:
    a first conductivity type of a semiconductor substrate having separately formed active areas and field areas formed with field insulating layers to isolate the active areas;
    a first gate insulating layer formed at respective substrate of the active areas;
    floating gates arranged at a predetermined interval on the first gate insulating layer;
    oxide layers respectively formed at the upper surface of the floating gates;
    a second gate insulating layer to be used as a tunneling insulating layer formed at lateral surfaces of the floating gates;
    control gates, each of which overlaps a pair of floating gates out of the floating gates;
    a second conductivity type of source areas formed at the active area, a part of which is overlapped with the same part of the floating gates, and at a part of the neighboring active area; and
    a second conductivity type of buried diffusion areas formed at the substrate of a part of the field area for preventing neighboring source areas of the same source line, out of source areas, from being isolated by the field insulating layer, and for making them electrically connected.

2. The device, as defined in claim 1, wherein the buried diffusion area is formed at the substrate of the periphery of the field insulating layer positioned between neighboring source areas.

3. The device, as defined in claim 2, wherein the field insulating layer is an insulating layer filled in the trench.

4. The device, as defined in claim 3, wherein the field insulating layer is made in a deposition structure of a USG (undoped silicate glass) layer and a PE-TEOS (plasma enhanced tetraethyorthosilicate) oxide layer.

5. The device, as defined in claim 1, wherein:
    a middle portion of each of the oxide layers is substantially thicker than the second gate insulating layer.

6. The device, as defined in claim 1, wherein:
    the oxide layers, formed at the upper surface of the floating gates, have a thickness of between 1000 to 2000 A.

7. The device, as defined in claim 1, wherein:
    the second gate insulating layer has a thickness of between 200 to 400 A.

8. A non-volatile semiconductor memory device of the present invention comprising:
    a first conductivity type of a semiconductor substrate having separately formed first active areas, second active areas formed between, and integrally connected to, parts of both sides of, pairs of the first active areas, and field areas formed with a field insulating layer for isolating the first active areas;
    first gate insulating layers respectively formed at the substrate of the first and second active areas;
    floating gates arranged at the first gate insulating layer in a predetermined interval;
    oxide layers respectively formed at the upper surfaces of the floating gates;
    second gate insulating layers, to be used as tunneling insulating layers, formed at the lateral surfaces of the floating gates;
    control gates, each of which overlaps a pair of floating gates out of the floating gates; and
    a second conductive type of active source areas formed at the first active areas, a part of which is overlapped at the same portion of the floating gates, and at a part of the neighboring first active areas, wherein the second active areas are integrally connected between the source areas to prevent the neighboring source areas of the same source line, out of the source areas, from being isolated by the field insulating layer and to make them electrically connected.

9. The device, as defined in claim 8, wherein the second active areas are ion implanted with a second conductive type of impurity.

10. A nonvolatile integrated circuit memory device, comprising:
    first and second EEPROM cells disposed side-by-side at spaced locations in a semiconductor substrate, said first and second EEPROM cells having first and second source regions of first conductivity type therein, respectively;
    a trench isolation region disposed in the semiconductor substrate and extending between said first and second EEPROM cells; and
    a buried source region of first conductivity type that extends in the semiconductor substrate at a location extending adjacent a bottom of said trench isolation region and electrically connects the source region of said first EEPROM cell to the source region of said second EEPROM cell.

11. The memory device of claim 10, wherein said first and second EEPROM cells comprise first and second split-gate EEPROM cells, respectively.

12. The memory device of claim 10, wherein said trench isolation region comprises a buried diffusion area of the second conductivity type.

13. The memory device of claim 12, further comprising first and second word lines that are electrically connected to first and second control electrodes of said first and second EEPROM memory cells, respectively, and extend in parallel in a first direction across the semiconductor substrate; and wherein said buried source region and said first and second source regions collectively form a portion of a source line that extends in a second direction across the semiconductor substrate which is orthogonal to the first direction.

14. A non-volatile semiconductor memory device comprising:
    a semiconductor substrate;
    a gate insulating layer formed on the semiconductor substrate;

floating gates arranged at predetermined intervals on the gate insulating layer;

oxide layers, each of which is on an upper surface of a respective floating gate, the oxide layers having a greater thickness over a middle portion of the upper surface of the floating gates than along an edge portion of the upper surface of the floating gates;

a tunneling insulating layer on lateral surfaces of the floating gates, wherein the thickness of the second gate insulating layer is substantially less than the thickness of the oxide layers over the middle portion of the upper surface of the floating gates; and control gates, each of which overlaps a pair of floating gates out of the floating gates.

15. The device, as defined in claim 14, wherein:
the oxide layers have a maximum thickness of between 1000, to 2000 A.

16. The device, as defined in claim 15, wherein:
the tunneling insulating layer has a thickness of between 200 to 400 A.

17. A non-volatile semiconductor memory device comprising:

a semiconductor substrate;

a first gate insulating layer formed on the semiconductor substrate;

floating gates arranged at predetermined intervals on the first gate insulating layer;

oxide layers, each of which is on an upper surface of respective floating gates;

control gates, each of which overlaps a pair of floating gates out of the floating gates;

source regions in the semiconductor substrate, each of the source regions adjacent to one of the pair of floating gates out of the floating gates; and drain regions in the semiconductor substrate, each of the drain regions self-aligned to the other one of the pair of floating gates out of the floating gates.

* * * * *